US011652193B2

United States Patent
Tsai et al.

(10) Patent No.: US 11,652,193 B2
(45) Date of Patent: May 16, 2023

(54) LIGHT-EMITTING DIODE DEVICE

(71) Applicant: Lextar Electronics Corporation, Hsinchu (TW)

(72) Inventors: Yi-Ting Tsai, Hsinchu (TW);
Hung-Chia Wang, Hsinchu (TW);
Chia-Chun Hsieh, Hsinchu (TW);
Hung-Chun Tong, Hsinchu (TW);
Yu-Chun Lee, Hsinchu (TW);
Tzong-Liang Tsai, Hsinchu (TW)

(73) Assignee: Lextar Electronics Corporation, Hsinchu (TW)

(*) Notice: Subject to any disclaimer, the term of this patent is extended or adjusted under 35 U.S.C. 154(b) by 82 days.

(21) Appl. No.: 17/083,329

(22) Filed: Oct. 29, 2020

(65) Prior Publication Data
US 2022/0029067 A1    Jan. 27, 2022

(30) Foreign Application Priority Data
Jul. 21, 2020 (TW) ................................. 109124646

(51) Int. Cl.
    *H01L 33/50* (2010.01)
(52) U.S. Cl.
    CPC .......... *H01L 33/502* (2013.01); *H01L 33/508* (2013.01)
(58) Field of Classification Search
    CPC .... H01L 33/502; H01L 33/504; H01L 33/508
    See application file for complete search history.

(56) References Cited

U.S. PATENT DOCUMENTS

| 7,663,714 B2 | 2/2010 | Haga et al. |
| 7,777,835 B2 | 8/2010 | Park et al. |
| 8,040,041 B2 | 10/2011 | Hosokawa et al. |
| 9,087,968 B2 | 7/2015 | Lee et al. |
| 9,496,464 B2 | 11/2016 | Yao et al. |
| 9,590,149 B2 | 3/2017 | Lim et al. |
| 9,741,907 B2 | 8/2017 | Oh et al. |
| 9,804,436 B2 | 10/2017 | Yokota |
| 9,905,736 B2 | 2/2018 | Seki et al. |
| 9,923,126 B2 | 3/2018 | Kaneko et al. |

(Continued)

FOREIGN PATENT DOCUMENTS

| CN | 101788737 A | 7/2010 |
| CN | 102738369 B | 6/2016 |

(Continued)

*Primary Examiner* — Julia Slutsker
*Assistant Examiner* — Dmitriy Yemelyanov
(74) *Attorney, Agent, or Firm* — CKC & Partners Co., LLC

(57) ABSTRACT

A light-emitting diode device is provided. First and second green conversion materials are respectively configured to convert a blue light emitted from a blue light-emitting diode to generate a first green light with a first wavelength range and a first wavelength FWHM, and a second green light with a second wavelength range and a second wavelength FWHM. The second wavelength FWHM is smaller than the first wavelength FWHM. A lower bound of the first wavelength range is smaller than a lower bound of the second wavelength range, and an upper bound of the second wavelength range is greater than an upper bound of the first wavelength range. An output light emitted from the light-emitting diode device has a spectral characteristic of less than 50% of TÜV Rheinland and more than 90% of wide color gamut.

10 Claims, 3 Drawing Sheets

(56) References Cited

U.S. PATENT DOCUMENTS

| | | |
|---|---|---|
| 10,128,415 B2 | 11/2018 | Huang et al. |
| 10,177,287 B1 | 1/2019 | Melman et al. |
| 10,312,419 B2 | 6/2019 | Oh et al. |
| 10,468,563 B2 | 11/2019 | Yoshimura et al. |
| 2011/0128718 A1 | 6/2011 | Ramer et al. |
| 2013/0070168 A1 | 3/2013 | Yokota et al. |
| 2017/0047488 A1 | 2/2017 | Kaneko et al. |
| 2017/0082674 A1 | 3/2017 | Lawton et al. |
| 2018/0323350 A1* | 11/2018 | Oh .................. H01L 33/504 |
| 2019/0041699 A1* | 2/2019 | David ............ G02F 1/133617 |
| 2019/0140148 A1* | 5/2019 | Yoshimura ........... H01L 33/504 |
| 2019/0254142 A1 | 8/2019 | Petluri et al. |
| 2019/0317362 A1* | 10/2019 | Huang ............ G02F 1/133603 |
| 2021/0060353 A1 | 3/2021 | Petluri et al. |

FOREIGN PATENT DOCUMENTS

| | | |
|---|---|---|
| CN | 109599471 A | 4/2019 |
| CN | 109860370 B | 10/2019 |
| CN | 110299440 A | 10/2019 |
| JP | 2015-061009 A | 3/2015 |
| JP | 5799212 B2 | 10/2015 |
| TW | 201102694 A1 | 1/2011 |
| TW | I580004 B | 4/2017 |

\* cited by examiner

LIGHT-EMITTING DIODE DEVICE

RELATED APPLICATIONS

This application claims priority to Taiwan Application Serial Number 109124646, filed Jul. 21, 2020, which is herein incorporated by reference.

BACKGROUND

Field of Invention

The present disclosure relates to a light-emitting diode device having two types of green conversion materials therein.

Description of Related Art

The statements in this section merely provide background information related to the present disclosure and do not necessarily constitute prior art.

Liquid crystal display (LCD) and light-emitting diode (LED) display devices have gradually become popular in the past ten years, and people can enjoy light sources with higher quality and higher energy conversion efficiency. Various improvements to display technology have also sprung up recently. In various sub-fields of display technologies, the improvement of human eye protection is an important trend. Light-emitting diodes currently used as light sources are made of blue light-emitting diodes with a wavelength of about 450 nm, which are converted into white light by light conversion materials and are used as light sources for displays. However, studies have pointed out that blue light with a wavelength between about 415 nm and about 455 nm is more harmful to the eyes, and can easily cause various diseases such as macular degeneration. Therefore, in recent years, a low blue light indicator which helps protect the eyes of users has been proposed.

At present, the products in the market that reduce blue light with the wavelength range that hurts the eyes are mostly performed by reducing the intensity of blue light and using long-wavelength blue light. Change in intensity distribution of various wavelengths emitted by the display device are mainly through software programs, or through specially designed filters to filter out blue light, so as to reduce the intensity of blue light received by the human eyes.

SUMMARY

Although the above method can protect the eyes, however, it also causes color distortion and makes the overall display effect felt by the users become worse, which decreases user experience.

In view of this, some embodiments of the present disclosure reveal a light emitting diode device including a blue light emitting diode and a light conversion material is provided. The light conversion material is distributed on a light exit path of the blue light-emitting diode. The light conversion material includes a first green conversion material, a second green conversion material, and a red conversion material. The first green conversion material is configured to convert a blue light emitted from the blue light-emitting diode to generate a first green light with a first wavelength range and a first wavelength full-width-half-maximum (FWHM). The second green conversion material is configured to convert the blue light and to generate a second green light with a second wavelength range and a second wavelength FWHM. The second wavelength FWHM is smaller than the first wavelength FWHM. A lower bound of the first wavelength range is smaller than a lower bound of the second wavelength range, and an upper bound of the second wavelength range is greater than an upper bound of the first wavelength range. The red conversion material is configured to convert the blue light and to generate a red light. The light-emitting diode emits an output light simultaneously having a spectral characteristic of less than 50% of TÜV Rheinland and more than 90% of wide color gamut.

In one or more embodiments of the present disclosure, a wavelength range of the blue light is between 445 nm and 470 nm.

In one or more embodiments of the present disclosure, a wavelength range of the red light is between 610 nm and 660 nm.

In one or more embodiments of the present disclosure, the first wavelength FWHM is greater than or equal to 40 nm, and the second wavelength FWHM is smaller than 40 nm.

In one or more embodiments of the present disclosure, a union of the first wavelength range and the second wavelength range is between 490 nm and 540 nm.

In one or more embodiments of the present disclosure, the first wavelength range is between 510 nm and 530 nm, the second wavelength range is between 520 nm and 540 nm, the first wavelength FWHM is between 60 nm and 100 nm, the second wavelength FWHM is between 20 nm and 40 nm, and the output light simultaneously has a spectral characteristic of less than 50% of TÜV Rheinland and more than 95% of Wide Color Gamut National Television System Committee (WCG-NTSC).

In one or more embodiments of the present disclosure, a wavelength range of the blue light is between 455 nm and 460 nm. A proportion of a first spectral area of the output light in a wavelength range between 415 nm and 455 nm to a second spectral area of the output light in a wavelength range between 400 nm and 500 nm is less than 25%. A proportion of the first spectral area to a third spectral area of the output light in a wavelength range between 380 nm and 780 nm is less than 30%.

In one or more embodiments of the present disclosure, a union of the first wavelength range and the second wavelength range is between 500 nm and 545 nm.

In one or more embodiments of the present disclosure, the first wavelength range is between 515 nm and 540 nm, and the second wavelength range is between 525 nm and 550 nm. The first wavelength FWHM is between 60 nm and 100 nm, and the second wavelength FWHM is between 20 nm and 40 nm. The output light simultaneously has a spectral characteristic of less than 50% of TÜV Rheinland and more than 90% of Digital Cinema Initiatives P3 (DCI-P3).

In one or more embodiments of the present disclosure, a wavelength range of the blue light is between 455 nm and 462 nm. A proportion of a first spectral area of the output light in a wavelength range between 415 nm and 455 nm to a second spectral area of the output light in a wavelength range between 400 nm and 500 nm is less than 25%. A proportion of the first spectral area to a third spectral area of the output light in a wavelength range between 380 nm and 780 nm is less than 30%.

The above-mentioned embodiments of the present disclosure use at least two green conversion materials to reduce the proportion of light intensity in the blue wavelength range which hurts the eyes, but still maintain wide color gamut. A relationship between the aforementioned two green conversion materials is that a wavelength of one green conversion material is distributed in shorter wavelength range of green light and with wider FWHM, and a wavelength of the other green conversion material is distributed in longer wavelength range of green light and with narrower FWHM.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
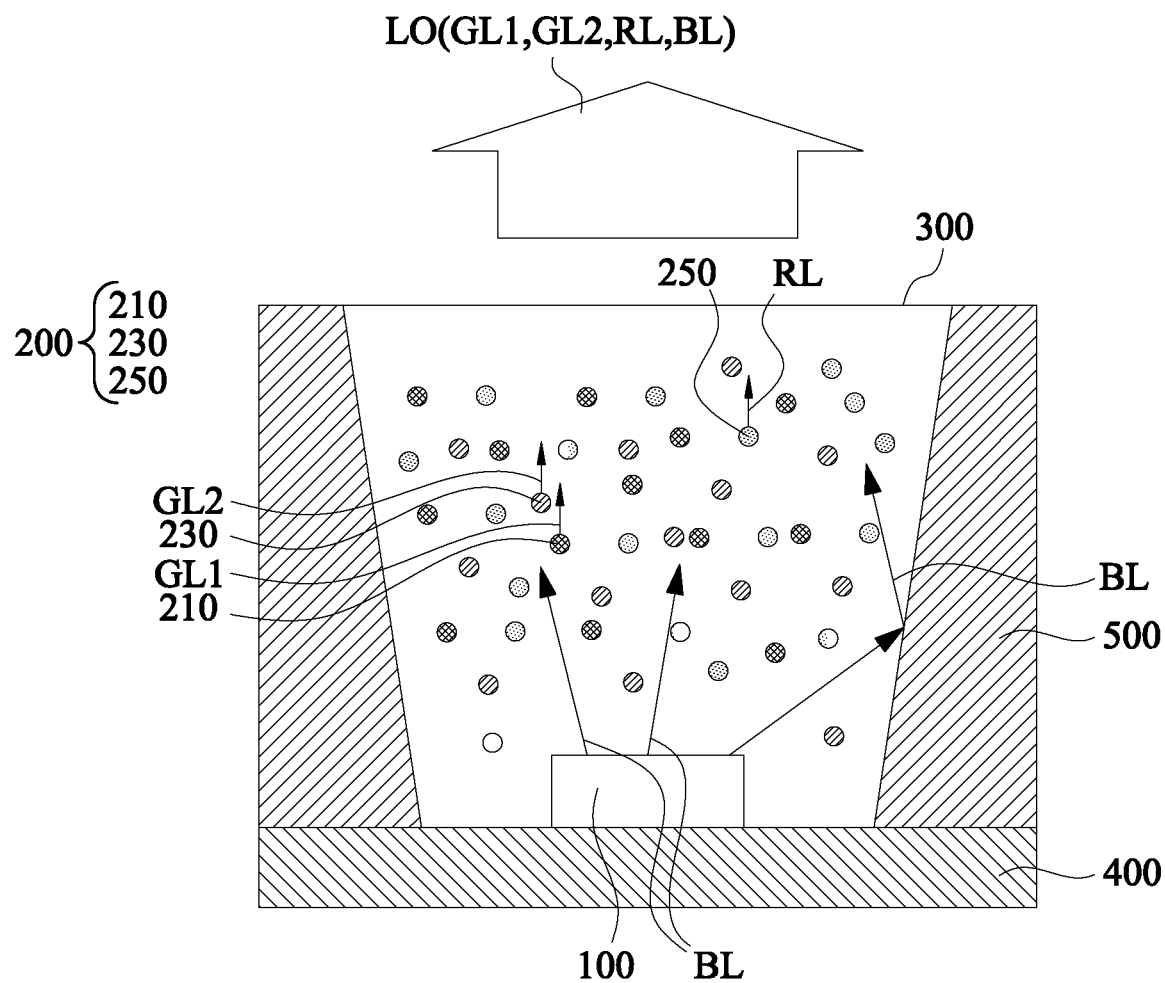
FIG. 1 is a schematic cross-sectional view of a light-emitting diode device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

Reference is made to FIG. 1. FIG. 1 is a schematic cross-sectional view of a light-emitting diode device 1000 according to some embodiments of the present disclosure. The light-emitting diode device 1000 includes a blue light-emitting diode 100 and a light conversion material 200. The light conversion material 200 includes a first green conversion material 210, a second green conversion material 230, and a red conversion material 250. In some embodiments, the light conversion material 200 may be uniformly distributed along a light exit path of the blue light-emitting diode 100 in a form of particles, and synergistically affect a wavelength distribution of exit light, but should not be limited thereto. In some embodiments, a wavelength range of a blue light BL emitted from the blue light-emitting diode 100 is between 445 nm and 470 nm.

A first green conversion material 210 is configured to convert the blue light BL emitted from the blue light-emitting diode 100 to generate a first green light GL1 having a first wavelength range and a first wavelength full-width-half-maximum (FWHM). A second green conversion material 230 is configured to convert said blue light BL and to generate a second green light GL2 having a second wavelength range and a second wavelength FWHM. The second wavelength FWHM is smaller than the first wavelength FWHM. That is, a width of the second wavelength FWHM is narrower than a width of the first wavelength FWHM. In some embodiments, the first wavelength FWHM is greater than or equal to 40 nm, and the second wavelength FWHM is smaller than 40 nm. A lower bound of the first wavelength range of the first green light GL1 is smaller than a lower bound of the second wavelength range of the second green light GL2, and an upper bound of the second wavelength range is greater than an upper bound of the first wavelength range. In other words, in comparison between the first green light GL1 and the second green light GL2, the first green light GL1 as a whole is in a region of green light having shorter wavelength and wider wavelength FWHM, while the second green light GL2 as a whole is in a region of green light having longer wavelength and narrower wavelength FWHM. By mixing (matching) the first green light GL1 and the second green light GL2 as mentioned, a proportion of blue light that is harmful to the eyes can be effectively reduced, while maintaining performance of wide color gamut.

The first wavelength range and the second wavelength range may be two wavelength ranges that are completely separated (without overlap) or partially overlapped. In the embodiments of partially overlapping, a mixed light spectrum of the first green light GL1 and the second green light GL2 further has a better symmetrical shape than the embodiments of non-overlapping, which make a color purity of the embodiments of partially overlapping enhance further as compared to the embodiments of non-overlapping.

A red conversion material 250 is configured to convert the blue light BL and to generate a red light RL. In some embodiments, a wavelength range of the red light RL is between 610 nm and 660 nm.

Figure 2:
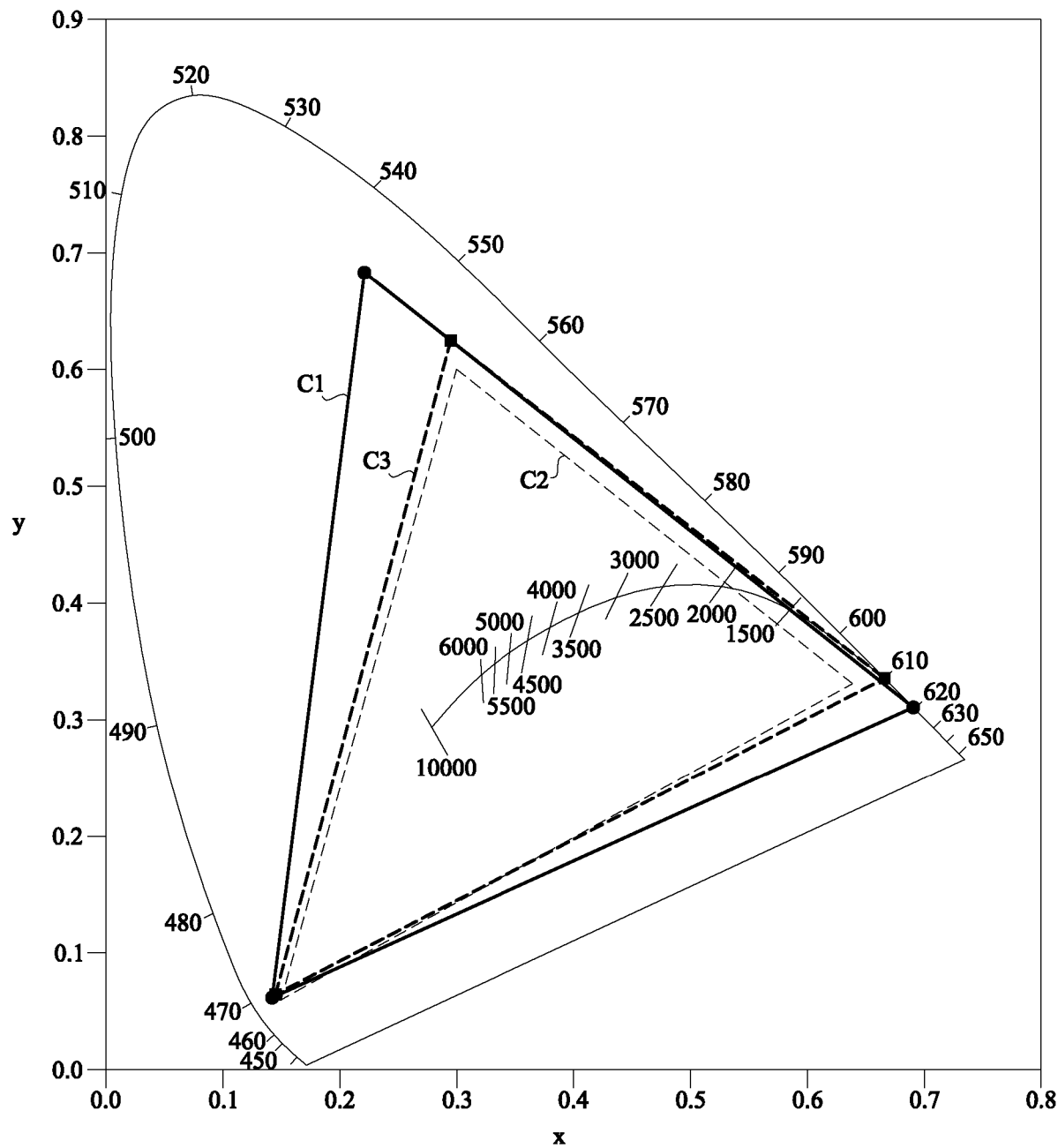
FIG. 2 is a comparative diagram among the color gamut distribution characteristics in some embodiments of the present disclosure and the color gamut standard and also the existing low blue light technology.

Under a mixing of the first green light GL1, the second green light GL2, the red light RL, and part of the unconverted blue light BL, an output light LO emitted from the light-emitting diode device 1000 simultaneously has a spectral characteristic of less than 50% of TÜV Rheinland and more than 90% of wide color gamut (e.g., NTSC or DCI-P3, official names will be described later). Reference is made to FIG. 2, which is related to the embodiments of the present disclosure that maintain a sufficiently wide coverage in the color gamut standard. FIG. 2 is a comparative diagram among the color gamut distribution characteristics in some embodiments of the present disclosure, the color gamut standard, and also the existing low blue light technology. The expression in FIG. 2 is the chromaticity coordinate system of the International Commission on Illumination (CEI), that is, the common CIE1931 chromaticity coordinate diagram. Briefly, in this coordinate diagram, it is red when x is greater than 0.6, and it is green when y is greater than 0.6. Since the aforementioned CIE1931 chromaticity coordinate diagram is a standard coordinate diagram which is commonly used. Therefore, introductions on the principle of the chromaticity coordinate diagram and meanings of numerical values on the coordinate are omitted here.

Reference is still made to FIG. 2. A first color gamut range C1 corresponding to the embodiments of the present disclosure is capable of completely covering a second color gamut range C2 which is covered by the standard Red Green Blue (sRGB) space. Furthermore, the embodiments of the present disclosure is capable of completely covering a third color gamut range C3 covered by a color gamut range of an existing liquid crystal display (LCD). The comparison presented in FIG. 2 shows that the first color gamut range C1 covered by the embodiments of the present disclosure at least has color gamut coverage equal to or greater than that of existing technologies.

Two exemplary embodiments will be disclosed below, and the wavelength distribution and materials of the first green light GL1 and the second green light GL2 will be disclosed in more detail. The remaining parts without specifically mentioned, such as the wavelength range of the red light RL, can be regarded as the same as the description in the above paragraphs. It should be noted that these two types of embodiments do not limit the scope of the present disclosure.

In the embodiments of a first type, a union of the first wavelength range of the first green light GL1 and the second wavelength range of the second green light GL2 is between 490 nm and 540 nm. In some specific embodiments, the first wavelength range is between 510 nm and 530 nm, and the first wavelength FWHM is between 60 nm and 100 nm. The second wavelength range is between 520 nm and 540 nm, and the second wavelength FWHM is between 20 nm and 40 nm. Under the above conditions, the output light LO simultaneously has a spectral characteristic of less than 50% of TÜV Rheinland and more than 95% of Wide Color Gamut National Television System Committee (WCG-NTSC). More specifically, the characteristic that the first green light GL1 having shorter green light wavelength and wider first wavelength FWHM as compared to the second green light GL2 helps to achieve the aforementioned low blue light effect.

In some specific embodiments of the first type, a wavelength range of the blue light BL is between 455 nm and 460 nm. A proportion of a first spectral area of the output light LO in a wavelength range between 415 nm and 455 nm to a second spectral area of the output light LO in a wavelength range between 400 nm and 500 nm (i.e., TÜV standard) is less than 25%. In some cases, it is even less than 20%. In addition, a proportion of the first spectral area to a third spectral area of the output light LO in a wavelength range between 380 nm and 780 nm is less than 30%. The "spectral area" referred to herein is an area enclosed by a spectral curve drawn in a coordinate in which a horizontal axis is the wavelength and a vertical axis is the light intensity. The spectral curve itself is regarded as an upper boundary of the vertical axis, and zero point of the vertical axis (i.e., horizontal axis) is regarded as a lower boundary of the vertical axis. The area represents the overall light intensity of the wavelength range of interest (which is incident into the eyes). The foregoing proportions show that these specific embodiments can simultaneously achieve the effects of wide color gamut and reducing the blue light that hurts the eyes. The demonstration of the low blue light as mentioned is better than the low blue light products using 460 nm blue light in the existing technologies. These existing low blue light products can only achieve less than 28% of TÜV.

In the embodiments of a second type, a union of the first wavelength range of the first green light GL1 and the second wavelength range of the second green light GL2 is between 500 nm and 545 nm. In some specific embodiments, the first wavelength range is between 515 nm and 540 nm, and the first wavelength FWHM is between 60 nm and 100 nm. The second wavelength range is between 525 nm and 550 nm, and the second wavelength FWHM is between 20 nm and 40 nm. The output light LO simultaneously has a spectral characteristic of less than 50% of TÜV Rheinland and more than 90% of Digital Cinema Initiatives P3 (DCI-P3).

In some specific embodiments of the second type, a wavelength range of the blue light BL is between 455 nm and 462 nm, a proportion of a first spectral area in a wavelength range between 415 nm and 455 nm to a second spectral area in a wavelength range between 400 nm and 500 nm of the output light is less than 25%, and a proportion of the first spectral area to a third spectral area in a wavelength range between 380 nm and 780 nm is less than 30%. The foregoing proportions show that these specific embodiments can simultaneously achieve the effects of wide color gamut and reducing the blue light that hurts the eyes.

In the two types of embodiments as mentioned, the first green conversion material 210 may be selected from one of or a combination of Yttrium Aluminum Garnet (YAG), Lutetium Aluminum Garnet (LuGA), silicate, and nitrogen oxide phosphor (e.g., $BaSrSi_2N_2O_2$). The second green conversion material 230 may be selected from one of or a combination of Green Quantum Dot (GQD) and Silicate phosphors (e.g., $NaK(Li_3SiO_4)_2$ or UNB).

The UNB light conversion material as mentioned refers to a light conversion material that includes a general formula (1) listed below and satisfies the following condition (2). The general formula (1) is $M_mA_aC_cE_e{:}ES_xRE_y$. "M" is at least one element selected from a group consisting of Ca, Sr, and Ba, where $2 \leq m \leq 3$. "A" is at least one element selected from the group consisting of Mg, Mn, Zn, and Cd, where $0.01 \leq a \leq 1$. "C" is at least one element selected from the group consisting of Si, Ge, Ti, and Hf, where $1 \leq c \leq 9$. "E" is at least one element selected from the group consisting of O, S, and Se, where $5 \leq e \leq 7$. "ES" is at least one element selected from the group consisting of divalent Eu, Sm, and Yb, where $0 \leq x \leq 3$. "RE" is at least one element selected from the group consisting of trivalent Ce, Pr, Nd, Sm, Eu, Gd, Tb, Dy, Ho, Er, and Tm, where $0 \leq y \leq 3$. The condition (2) is $x+y=3$.

Figure 3:
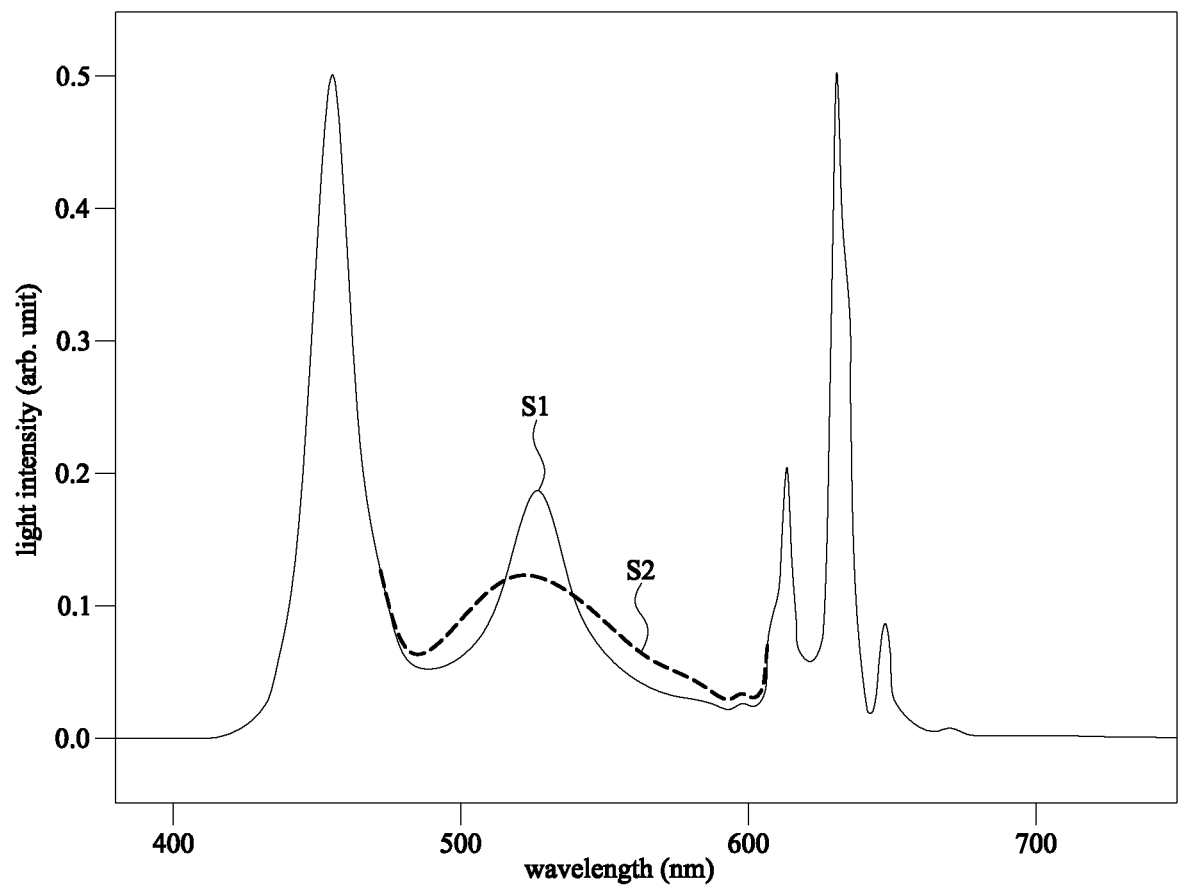
FIG. 3 is a comparative diagram of a spectral distribution between some embodiments of the present disclosure and existing low blue light products.

The aforementioned benefits of simultaneously achieving the wide color gamut and protecting the eyes from damage (also known as low blue light) can be explained and realized by a wavelength distribution in the embodiments of the present disclosure. Reference is made to FIG. 3. FIG. 3 is a comparative diagram of a spectral distribution between some embodiments of the present disclosure and the existing low blue light products. As shown by arrows in the figure, a difference between a first spectral distribution 51 presented by some embodiments of the present disclosure and a second spectral distribution S2 presented by the existing low blue light products is that, the first spectral distribution 51 has a higher light intensity peak (protrusion) in a range between about 520 nm and about 550 nm than that of the second spectral distribution S2. The rest of the spectral range without dotted lines represent portions where the first spectral distribution 51 and the second spectral distribution S2 are overlapped. In this way, the light intensity of the green light range that the human eyes are most sensitive (that is, light between about 520 nm and about 550 nm as mentioned above) can still be maintained while the proportion of the blue light band that hurts the eyes is reduced, so as to achieve the purpose of simultaneously achieving the wide color gamut and protecting the eyes from damage as mentioned in this paragraph.

In some embodiments, the light-emitting diode device 1000 further includes a filling material 300 distributed around the blue light-emitting diode 100. The filling material 300 may be configured to improve or adjust a light output efficiency of the light-emitting diode device 1000 by refractive index matching, and may be used to be mixed with the first green conversion material 210, the second green conversion material 230, and the red conversion material 250 as described above. In specific embodiments, the light-emitting diode device 1000 may also include a substrate 400 that carries the blue light-emitting diode 100 and a side wall 500 that guides a direction of output light path. It is noted that the content of this paragraph is only an example of possibilities of some applications, and is not intended to limit the scope of the present disclosure.

In summary, the embodiments of the present disclosure provide a light-emitting diode device. With a combination of a blue light-emitting diode, a first green conversion material, a second green conversion material, and a red conversion material, an output light of the light-emitting diode device achieves dual benefits of reducing a proportion of a blue light band that hurts the eyes and still maintaining wide color gamut. A wavelength of the first green conversion material is distributed in shorter wavelength range of green light and with wider FWHM, and a wavelength of the second green conversion material is distributed in longer wavelength range of green light and with narrower FWHM.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light-emitting diode device, comprising:
   a blue light-emitting diode;
   a light conversion material distributed on a light exit path of the blue light-emitting diode, the light conversion material comprising:
      a first green conversion material configured to convert a blue light emitted from the blue light-emitting diode and to generate a first green light having a first wavelength range and a first wavelength full-width-half-maximum;
      a second green conversion material configured to convert the blue light and to generate a second green light having a second wavelength range and a second wavelength full-width-half-maximum, the second wavelength full-width-half-maximum being smaller than the first wavelength full-width-half-maximum, wherein a lower bound of the first wavelength range is smaller than a lower bound of the second wavelength range, and an upper bound of the second wavelength range is greater than an upper bound of the first wavelength range; and
      a red conversion material configured to convert the blue light and to generate a red light,
   wherein the light-emitting diode device emits an output light, and the output light has a spectral characteristic of more than 90% of wide color gamut, wherein the wide color gamut is selected from at least one of Wide Color Gamut National Television System Committee (WCG-NTSC) and Digital Cinema Initiatives P3 (DCI-P3), the first wavelength full-width-half-maximum is between 60 nm and 100 nm, the second wavelength full-width-half-maximum is between 20 nm and 40 nm, and a first proportion of a first spectral area of the output light in a third wavelength range between 415 nm and 455 nm to a second spectral area of the output light in a fourth wavelength range between 400 nm and 500 nm is less than 50%.

2. The light-emitting diode device of claim 1, wherein a wavelength range of the blue light is between 445 nm and 470 nm.

3. The light-emitting diode device of claim 1, wherein a wavelength range of the red light is between 610 nm and 660 nm.

4. The light-emitting diode device of claim 1, wherein the first wavelength range is between 510 nm and 530 nm, the second wavelength range is between 520 nm and 540 nm, and the output light has the spectral characteristic of more than 95% of Wide Color Gamut National Television System Committee (WCG-NTSC).

5. The light-emitting diode device of claim 4, wherein a wavelength range of the blue light is between 455 nm and 460 nm, the first proportion of the first spectral area of the output light in the third wavelength range between 415 nm and 455 nm to the second spectral area of the output light in the fourth wavelength range between 400 nm and 500 nm is less than 25%, and a second proportion of the first spectral area to a third spectral area of the output light in a fifth wavelength range between 380 nm and 780 nm is less than 30%.

6. The light-emitting diode device of claim 1, wherein the first wavelength range and the second wavelength range collectively cover from at least 500 nm to at most 545 nm.

7. The light-emitting diode device of claim 6, wherein the first wavelength range is between 515 nm and 540 nm, the second wavelength range is between 525 nm and 550 nm, and the output light has the spectral characteristic of more than 90% of Digital Cinema Initiatives P3 (DCI-P3).

8. The light-emitting diode device of claim 7, wherein a wavelength range of the blue light is between 455 nm and 462 nm, the first proportion of the first spectral area of the output light in the third wavelength range between 415 nm and 455 nm to the second spectral area of the output light in the fourth wavelength range between 400 nm and 500 nm is less than 25%, and a second proportion of the first spectral area to a third spectral area of the output light in a fifth wavelength range between 380 nm and 780 nm is less than 30%.

9. A light-emitting diode device, comprising:
   a blue light-emitting diode;
   a light conversion material distributed on a light exit path of the blue light-emitting diode, the light conversion material comprising:
   a first green conversion material configured to convert a blue light emitted from the blue light-emitting diode and to generate a first green light having a first wavelength range and a first wavelength full-width-half-maximum;
   a second green conversion material configured to convert the blue light and to generate a second green light having a second wavelength range and a second wavelength full-width-half-maximum, the second wavelength full-width-half-maximum being smaller than the first wavelength full-width-half-maximum, wherein a lower bound of the first wavelength range is smaller than a lower bound of the second wavelength range, and an upper bound of the second wavelength range is greater than an upper bound of the first wavelength range; and a red conversion material configured to convert the blue light and to generate a red light, wherein the light-emitting diode device emits an output light, and the output light has a spectral characteristic more than 90% of wide color gamut, wherein the wide color gamut is selected from at least one of Wide Color Gamut National Television System Committee (WCG-NTSC) and Digital Cinema Initiatives P3 (DCI-P3), the first wavelength full-width-half-maximum is between 60 nm and 100 nm, the second wavelength full-width-half-maximum is between 20 nm and 40 nm, and a proportion of a first spectral area of the output light in a third wavelength range between 415 nm and 455 nm to a second spectral area of the output light in a fourth wavelength range between 400 nm and 500 nm is less than 25%.

10. A light-emitting diode device, comprising:

a blue light-emitting diode;

a light conversion material distributed on a light exit path of the blue light-emitting diode, the light conversion material comprising:

a first green conversion material configured to convert a blue light emitted from the blue light-emitting diode and to generate a first green light having a first wavelength range and a first wavelength full-width-half-maximum;

a second green conversion material configured to convert the blue light and to generate a second green light having a second wavelength range and a second wavelength full-width-half-maximum, the second wavelength full-width-half-maximum being smaller than the first wavelength full-width-half-maximum, wherein a lower bound of the first wavelength range is smaller than a lower bound of the second wavelength range, and an upper bound of the second wavelength range is greater than an upper bound of the first wavelength range, and the second green conversion material comprises $NaK(Li_3SiO_4)_2$, a light conversion material, or a combination thereof, wherein the light conversion material comprises a general formula (1) listed below and satisfies a condition (2), the general formula (1) is $M_MA_aC_cE_e{:}ES_xRE_y$, M is at least one first element selected from the group consisting of Ca, Sr, and Ba, where $2 \leq m \leq 3$, A is at least one second element selected from the group consisting of Mg, Mn, Zn, and Cd, where $0.01 \leq a \leq 1$, C is at least one third element selected from the group consisting of Si, Ge, Ti, and Hf, where $1 \leq c \leq 9$, E is at least one fourth element selected from the group consisting of O, S, and Se, where $5 \leq e \leq 7$, ES is at least one fifth element selected from the group consisting of divalent Eu, Sm, and Yb, where $0 \leq x \leq 3$, RE is at least one sixth element selected from the group consisting of trivalent Ce, Pr, Nd, Sm, Eu, Gd, Tb, Dy, Ho, Er, and Tm, where $0 \leq y \leq 3$, and the condition (2) is $x+y=3$; and a red conversion material configured to convert the blue light and to generate a red light, wherein the light-emitting diode device emits an output light, and the output light has a spectral characteristic more than 90% of wide color gamut, wherein the wide color gamut is selected from at least one of Wide Color Gamut National Television System Committee (WCG-NTSC) and Digital Cinema Initiatives P3 (DCI-P3), the first wavelength range and the second wavelength range collectively cover from at least 490 nm to at most 540 nm.

* * * * *